United States Patent [19]
Roesner

[11] Patent Number: 5,690,306
[45] Date of Patent: Nov. 25, 1997

[54] FILLER BRACKET HAVING IMPROVED ELECTROMAGNETIC SHIELDING

[75] Inventor: Arlen L. Roesner, Fort Collins, Colo.

[73] Assignee: Hewlett-Packard Company, Palo Alto, Calif.

[21] Appl. No.: 601,637

[22] Filed: Feb. 14, 1996

[51] Int. Cl.⁶ ................................................. H05K 5/00
[52] U.S. Cl. .................... 248/222.52; 248/27.1; 361/683
[58] Field of Search .................. 248/27.1, 221.11, 248/222.52, 223.21; 403/348, 349, 350; 411/551, 553, 84, 85, 104; 312/293.3, 223.2; 361/683, 724, 684, 686

[56] References Cited

U.S. PATENT DOCUMENTS

| | | | |
|---|---|---|---|
| 1,867,206 | 7/1932 | Brady | 248/222.52 X |
| 3,313,509 | 4/1967 | Lockert | 248/222.52 X |
| 4,212,445 | 7/1980 | Hagen | 248/222.52 X |
| 5,076,619 | 12/1991 | Chi | 361/683 X |
| 5,163,833 | 11/1992 | Olsen et al. | 361/683 X |
| 5,224,869 | 7/1993 | Lee | 312/223.2 X |
| 5,228,319 | 7/1993 | Holley et al. | 361/683 X |
| 5,542,757 | 8/1996 | Chang | 312/293.3 X |

FOREIGN PATENT DOCUMENTS

2262388 A  6/1993  United Kingdom ........... 361/724

*Primary Examiner*—Ramon O. Ramirez
*Assistant Examiner*—Derek J. Berger

[57] ABSTRACT

A filler bracket assembly according to the present invention may comprise a cover sized to abut against a card cage panel and to substantially cover an opening in the card cage panel. A clamp rotatably mounted to the cover includes a panel engaging member that engages the two opposed sides of the opening in the panel and draws the cover tightly against the panel when the clamp is rotated from a disengaged position to an engaged position.

17 Claims, 6 Drawing Sheets

FILLER BRACKET HAVING IMPROVED ELECTROMAGNETIC SHIELDING

FIELD OF INVENTION

This invention generally relates to covers for closing openings in panels and more specifically to a filler bracket for ISA/EISA/PCI form factor card cages.

BACKGROUND

Continuing advances in electronic circuits and integration are resulting in ever smaller and more powerful electronic devices and computers. For example, the personal computer (PC) produced today has significantly more capability than PCs produced just a few years ago. Generally speaking, the increased capacity of electronic devices and computers is due to increased processor speed, integration and/or component density. That is, more electronic components are being packaged more closely together and in smaller volumes than ever before. Unfortunately, an undesirable side effect associated with such increasing component density and integration is that the resulting electronic device tends to produce stronger electromagnetic fields, which, if allowed to escape from the housing or chassis of the electronic device, appear as electromagnetic interference or EMI. In most countries, the amount of EMI that a given electronic device is allowed to produce is strictly regulated. Consequently, new and better methods of reducing the EMI produced by electronic devices such as computers are always desirable.

One area that tends to contribute to the EMI produced by PCs is the ISA/EISA/PCI standard form factor card cage. Such card cages or expansion slots, as they are commonly known, are provided in PCs as a means for adding additional systems, features, and/or memory to the PC by simply installing additional circuit cards in the expansion slots. Since some such additional circuit cards have external ports to allow them to communicate with external equipment, such as displays, printers, pointing devices, etc., the card cages or expansion slots are typically installed near the rear panel of the PC housing and an opening or access slot is provided in the rear panel so that the external ports of any such additional circuit cards can be accessed by the user. However, since not all circuit cards have such external ports, and since not all of the expansion slots may be in use at a given time, it is common to cover the opening in the rear panel of the computer with a "filler bracket" to prevent dust and other debris from entering the computer. Another function of the filler bracket is to act as a shield to prevent the electromagnetic fields produced by the internal electronic circuitry from escaping through the opening or expansion slot as EMI.

A common type of filler bracket or cover used in conjunction with the ISA/EISA/PCI style card cages comprises a rectangular cover or bracket having a tongue at one end and a mounting flange on the other. In order to close the hole in the rear panel of the computer, the tongue end of the filler bracket or cover is inserted into the corresponding receptacle in the card cage. The mounting flange may then be secured to the card cage frame by any convenient means, usually by a screw.

While filler brackets or covers of the type described above physically cover the opening in the rear panel, they tend to make rather poor EMI shields, usually because the filler bracket does not fit tightly against the opening in the panel. The poor fit is usually the result of bowing that can occur along the length of the bracket, which tends to result in a long thin gap that extends along the length of the filler bracket. Also, the screw used to secure the flange-end of the filler bracket may cause one edge of the bracket to rotate away from the rear panel when it is tightened, again opening up a gap along the length of the filler bracket. Compounding the problem is the fact that the dimensions of the opening or slot in the rear panel are such that a significant amount of EMI may be emitted if the filler bracket does not fit tightly against the panel along its entire length. That is, the length of the slot is usually some integer multiple or fraction of a significant number of the various wavelengths of EMI produced by the electronic device. Therefore, any gaps occurring along the length of the opening tend to act as tuned ports, easily allowing the escape of certain wavelengths of EMI.

Consequently, a need exists for an improved filler bracket for closing the access openings provided for card cages. Such an improved filler bracket should provide for significant reductions in EMI leakage, but without the need to modify the existing card cage configurations, most of which are standardized. Ideally, such an improved filler bracket should be easy to install and remove so that the user can add and replace cards, as the case may be. Additional advantages could be realized if such an improved filler bracket could be secured over the hole without the need to rely on separate components or fasteners and without the need for tools.

SUMMARY OF THE INVENTION

A filler bracket assembly according to the present invention may comprise a cover sized to abut against a card cage panel and to substantially cover an opening in the card cage panel. A clamp rotatably mounted to the cover includes a panel engaging member that engages the two opposed sides of the opening in the panel and draws the cover tightly against the panel when the clamp is rotated from a disengaged position to an engaged position.

In one embodiment, the panel engaging member may include first and second panel engaging shoulders mounted to opposite sides of one end of an elongate pivot shaft. The first and second panel engaging shoulders engage the two opposed sides of the opening on the external surface of the panel. The other end of the elongate pivot shaft may include a clamp retaining shoulder for engaging the back side of the cover. The clamp may also include a retaining arm for engaging the back side of the cover and preventing the clamp from being accidentally withdrawn from the hole in the cover.

A method of closing off an opening in the panel may include the steps of positioning the cover against the internal surface of the panel and over the opening and then rotating the clamp from a disengaged position to an engaged position, wherein the clamp draws the cover firmly against the internal surface of the panel.

BRIEF DESCRIPTION OF THE DRAWING

Illustrative and presently preferred embodiments of the invention are shown in the accompanying drawing in which.

DETAILED DESCRIPTION OF THE INVENTION

Figure 1:
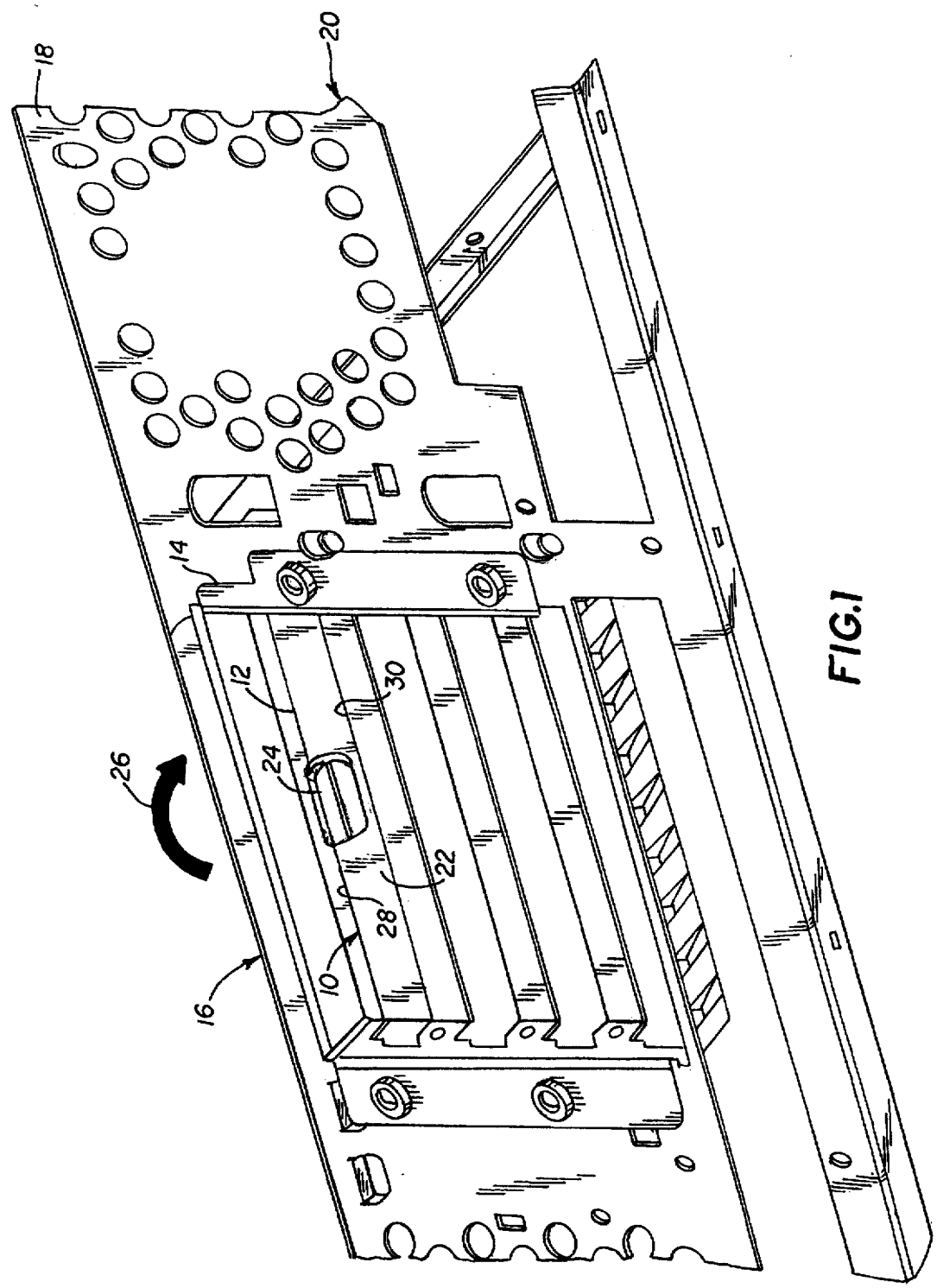
FIG. 1 is a perspective view of the external surface of a rear panel of a computer chassis showing the improved filler bracket installed over the opening of a card cage, but with the clamp in the disengaged position.
Figure 2:
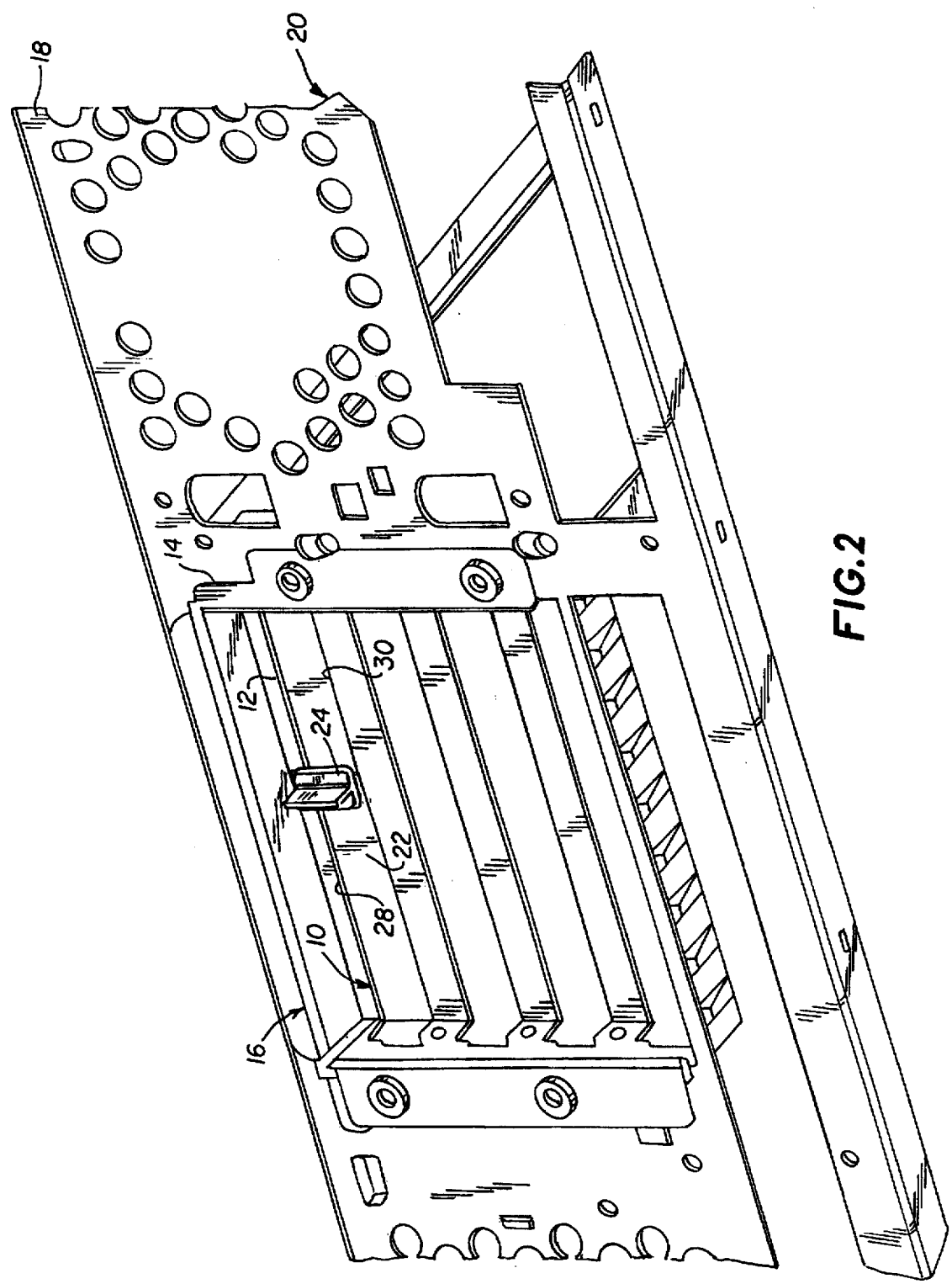
FIG. 2 is a perspective view of a rear panel shown in FIG. 1, but with the clamp of the improved filler bracket in the engaged position.

A filler bracket assembly 10 having improved EMI shielding is shown in FIGS. 1 and 2 as it could be used to cover an access slot or opening 12 in the rear panel 14 of a card cage 16. In one preferred embodiment, the card cage 16 may be mounted to the rear panel 18 of a chassis assembly 20 for a personal computer, although other configurations are also possible. The filler bracket assembly 10 comprises a rectangular cover 22 adapted to be removably retained by the card cage 16 and sized to cover the slot or opening 12. A clamp 24 is pivotally mounted to the cover 22 so that the clamp 24 can be rotated from a disengaged position, shown in FIG. 1, to an engaged or clamped position, shown in FIG. 2, by turning the clamp 24 in the direction of arrow 26. As the clamp 24 is turned to the engaged position (FIG. 2) it pulls or draws the cover 22 firmly against the opposed sides 28 and 30 of the rear panel 14 of card cage assembly 16.

Figure 5:
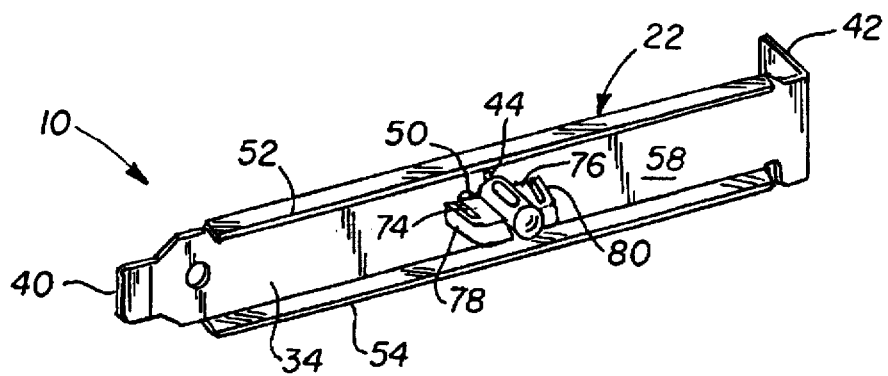
FIG. 5 is a perspective view of the rear side of the improved filler bracket with the clamp installed and in the disengaged position and also showing the bosses for restricting the rotation of the clamp.
Figure 6:
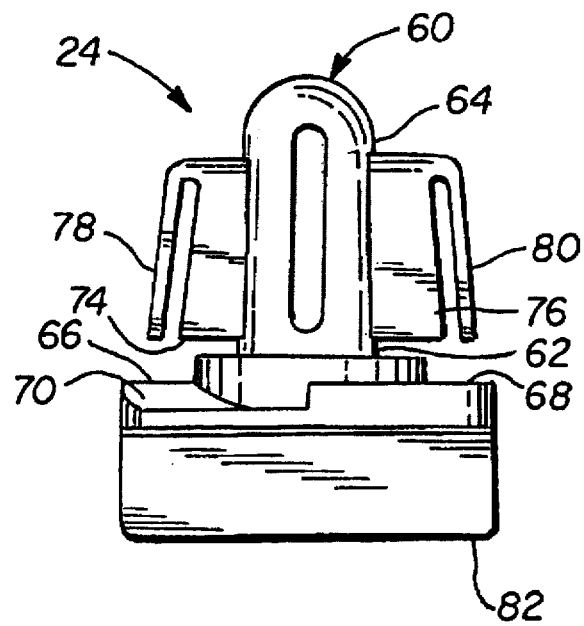
FIG. 6 is a front view in elevation of the clamp showing the cam shaped panel engaging shoulders.

Referring now to FIGS. 5 and 6, the clamp 24 includes pair of clamp retaining shoulders 74 and 76 that engage the back side 58 of cover 22 and allow the clamp 24 to pull or draw the cover 22 against the rear panel 14. A pair of resiliently deflectable retaining arms 78 and 80 also engage the back side 58 of cover 22 and prevent the clamp 24 from being accidently withdrawn from the hole 32.

If a user desires to add an additional card (not shown) to the computer circuitry (also not shown) that requires access through the slot or opening 12 (such as for an external serial or parallel port), the filler bracket assembly 10 can be easily removed by rotating the clamp 24 in the counter clockwise direction (i.e., opposite arrow 26) to move it from the engaged position (FIG. 2) to the disengaged position (FIG. 1). The filler bracket assembly 10 may then be removed from inside the chassis 20 in a conventional manner.

A significant advantage of the filler bracket assembly 10 according to the present invention is that as the clamp 24 is rotated to the engaged position it draws the cover 22 firmly against the opening 12 in the rear panel 14. The firm fit between the cover 22 and the opening 12 substantially eliminates gaps along the length of the cover 22 and opening 12, thus substantially reducing or eliminating the amount of EMI that can leak through the opening 12. Another advantage of the present invention is that the clamp 24 can be operated by hand and does not require the use of any special tools, such as a screwdriver, to secure and remove the filler bracket 10. Further, since the clamp 24 is also retained to the cover 22 by the resiliently deflectable retaining arms 78 and 80, the chances are minimized that the clamp 24 and cover 22 will become accidently separated and lost.

Having briefly described the filler bracket assembly 10, as well as some of its more significant features and advantages, the filler bracket assembly 10 according to the present invention will now be described in detail. Referring to FIGS. 1 and 2 simultaneously, the filler bracket assembly 10 is shown as it could be used to cover the opening 12 in the rear panel 14 of card cage 16. Card cage 16 may be mounted to the rear panel 18 of a computer chassis 20. In one preferred embodiment, the card cage 12 may comprise an ISA/EISA/PCI form card cage, although the invention could be utilized with other kinds of card cages or in any similar application, as would be obvious to persons having ordinary skill in the art. The filler bracket assembly 10 includes a clamp 24 for securing the cover 22 to the opposed sides 28, 30 of the opening 12. More specifically, the clamp 24 may be rotated from the disengaged position (shown in FIG. 1) to the engaged or clamped position (shown in FIG. 2) by rotating it in the clockwise direction, as indicated by arrow 26.

Figure 3:
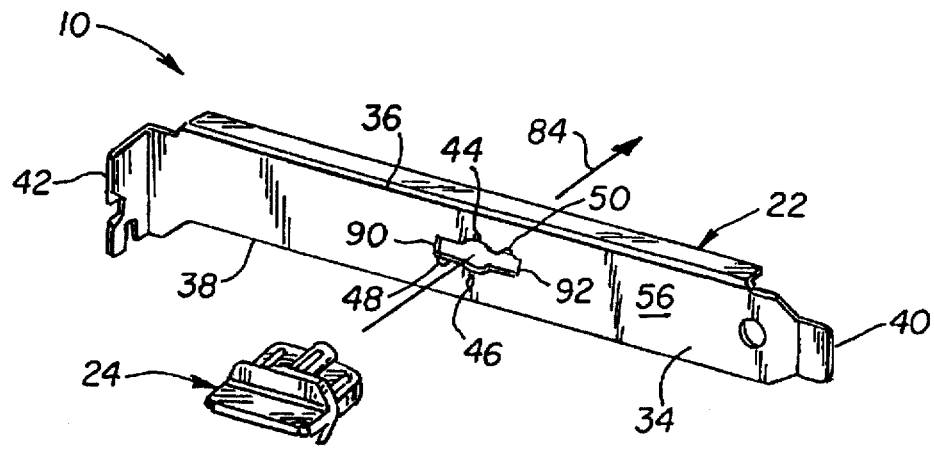
FIG. 3 is a perspective view of the front side of the improved filler bracket showing the hole for the clamp.
Figure 4:
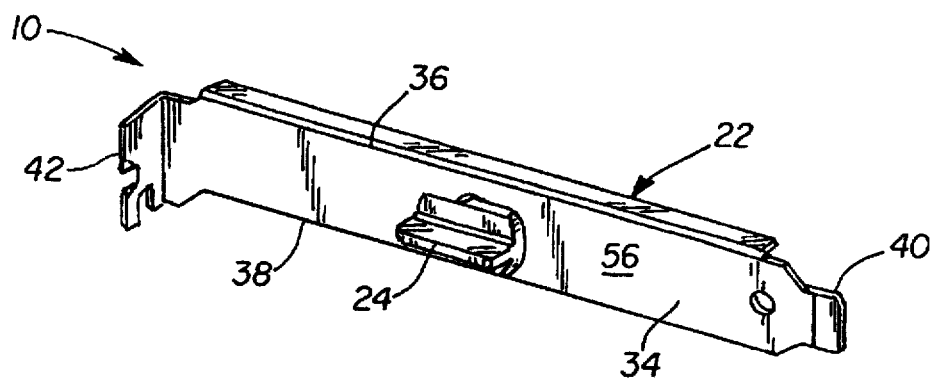
FIG. 4 is a perspective view of the front side of the improved filler bracket with the clamp installed and in the disengaged position.

Referring now to FIGS. 3–5, the filler bracket assembly 10 may comprise an elongate or rectangular cover 22 having a hole 32 therethrough adapted to pivotally receive the clamp 24. As will be described in greater detail below, hole 32 includes a pair of opposed notches 90 and 92 to accommodate the clamp retaining shoulders 74, 76 of clamp 24. While the cover 22 may take on different shapes and configurations depending on the particular card cage format in which it is to be used, in one preferred embodiment the cover 22 may generally comprise a rectangular main cover portion 34 having two opposed elongate sides 36 and 38. The cover 22 may also include a tongue end 40 and a bracket end 42 to assist in locating the cover 22 within the card cage 16, as will be described in greater detail below. The back side 58 (FIG. 5) of cover 22 may also include a plurality of raised bosses 44, 46, 48, and 50 to prevent the clamp 24 from being rotated beyond the engaged and disengaged positions, respectively. Specifically, bosses 44 and 46 engage the clamp retaining shoulders 74 and 76 to prevent the clamp 24 from being rotated clockwise beyond the engaged position (FIG. 2), whereas bosses 48 and 50 engage the shoulders 74 and 76 to prevent the clamp 24 from being rotated counter clockwise beyond the disengaged position (FIG. 1). Finally, it is preferred, but not required, that the cover 22 include a pair of stiffening flanges 52, 54 to help stiffen the cover 22 in the lengthwise direction, as best seen in FIG. 5.

In one preferred embodiment, the cover 22 is made from steel, although other materials could also be used. In the embodiment having a steel cover 22, the bosses 44, 46, 48, and 50 may be formed by partially piercing the front side 56 (FIG. 3) of main cover portion 34 to create the raised bosses 44, 46, 48, and 50 on the back side 58 (FIG. 5).

As was described above, the overall shape and configuration of the cover 22 is also dictated in large part by the particular configuration of the card cage in which it is to be used. For example, in the embodiment shown and described herein, the cover 22 is specifically configured to be used with the ISA/EISA/PCI card cage format. While other card cage formats may require covers having different shapes or configurations, persons having ordinary skill in the art will readily appreciate how to incorporate the present invention in such other covers after having become familiar with the details of the present invention.

Figure 7:
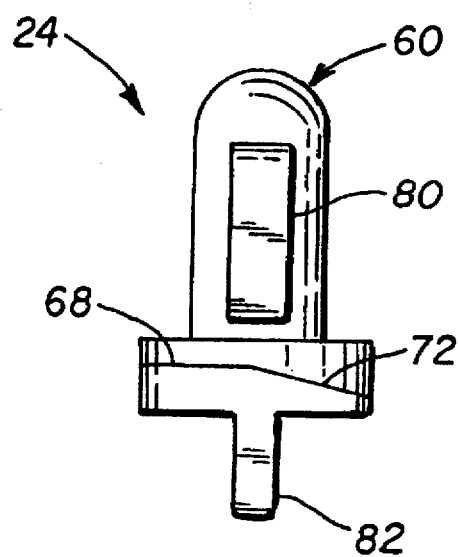
FIG. 7 is a side view in elevation of the clamp shown in FIG. 6.

The details of the clamp 24 are best seen by referring to FIGS. 6 and 7. Essentially, the clamp 24 comprises a cylindrically shaped main portion 60 having a proximal end 62 and a distal end 64. Proximal end 62 includes a first panel engaging shoulder 66 and a second panel engaging shoulder 68. Each panel engaging shoulder 66, 68 includes a respective ramp portion 70, 72 to aid the clamp 24 in drawing the cover 22 against the opposed sides 28 and 30 of opening 12 in panel 14 as the clamp 24 is rotated to the engaged position. See FIGS. 1 and 2. The distal end 64 of main portion 60 includes a pair of clamp retaining shoulders 74, 76 for axially retaining the clamp 24 within the hole 32 of cover 22. See FIG. 3. In one preferred embodiment, the clamp retaining shoulders 74, 76 also engage the respective raised bosses 44, 46, 48, and 50 on the back surface 58 of cover 22 (FIG. 5) to prevent the clamp 24 from being rotated clockwise beyond the engaged position (FIG. 2) and counter-clockwise beyond the disengaged position (FIGS. 1 and 5) in the manner already described. Clamp 24 also includes a pair of resiliently deflectable retaining arms 78, 80 to prevent the clamp 24 from being withdrawn from the hole 32 when the clamp is in the disengaged position. See FIG. 5. Finally, the proximal end 62 of clamp 24 may also include a blade or handle 82 to assist the user in rotating the clamp 24.

In one preferred embodiment, the clamp 24 is molded as a single piece from a glass-filled polycarbonate plastic, although any of a wide variety of other materials could also be used. Since the glass-filled polycarbonate material is fairly strong and tough, the clamp 24 may be inserted into the hole 32 of cover 22 by simply pushing it through the hole 32 in the direction indicated by arrow 84. See FIG. 3. As the clamp 24 is pushed through the hole 32, the resiliently deflectable retaining arms 78 and 80 are deflected inward toward the first and second panel engaging shoulders 74, 76, respectively, by the notches 90 and 92 on either side of the hole 32. Once the clamp 24 is fully inserted, the resiliently deflectable retaining arms spring back outward toward their original positions, engaging the back side 58 of cover 22 and preventing the clamp 24 from being accidently drawn back out from its seated position in hole 32. Of course, the clamp 24 may be purposefully withdrawn from the hole 32 by moving the clamp to the disengaged position (FIGS. 1 and 5) and by pressing together the arms 78 and 80 so that they will clear the notches 90 and 92.

Figure 8:
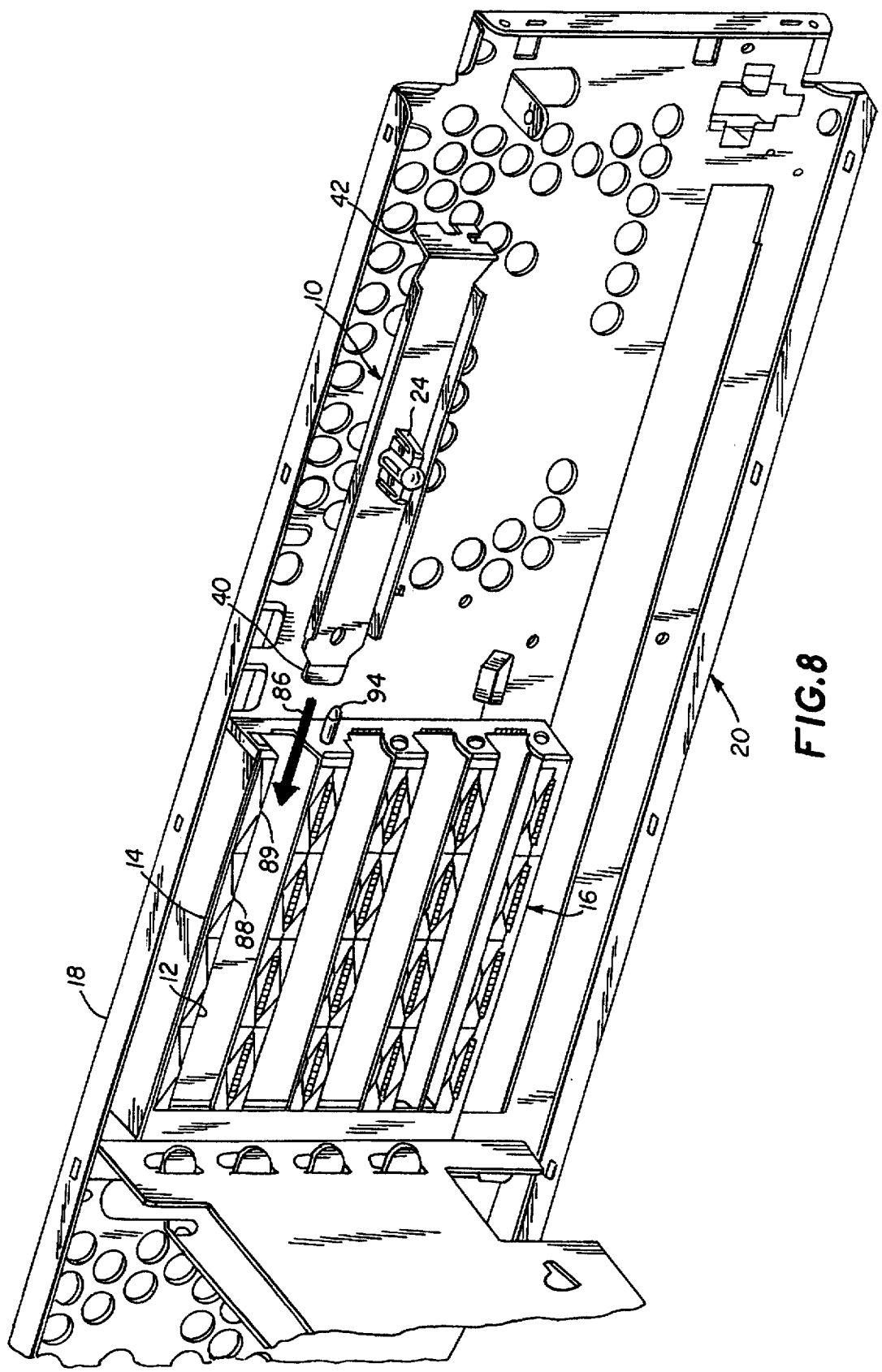
FIG. 8 is a perspective view of the internal surface of the rear panel of the computer chassis showing how the filler bracket is positioned over the card opening.
Figure 9:
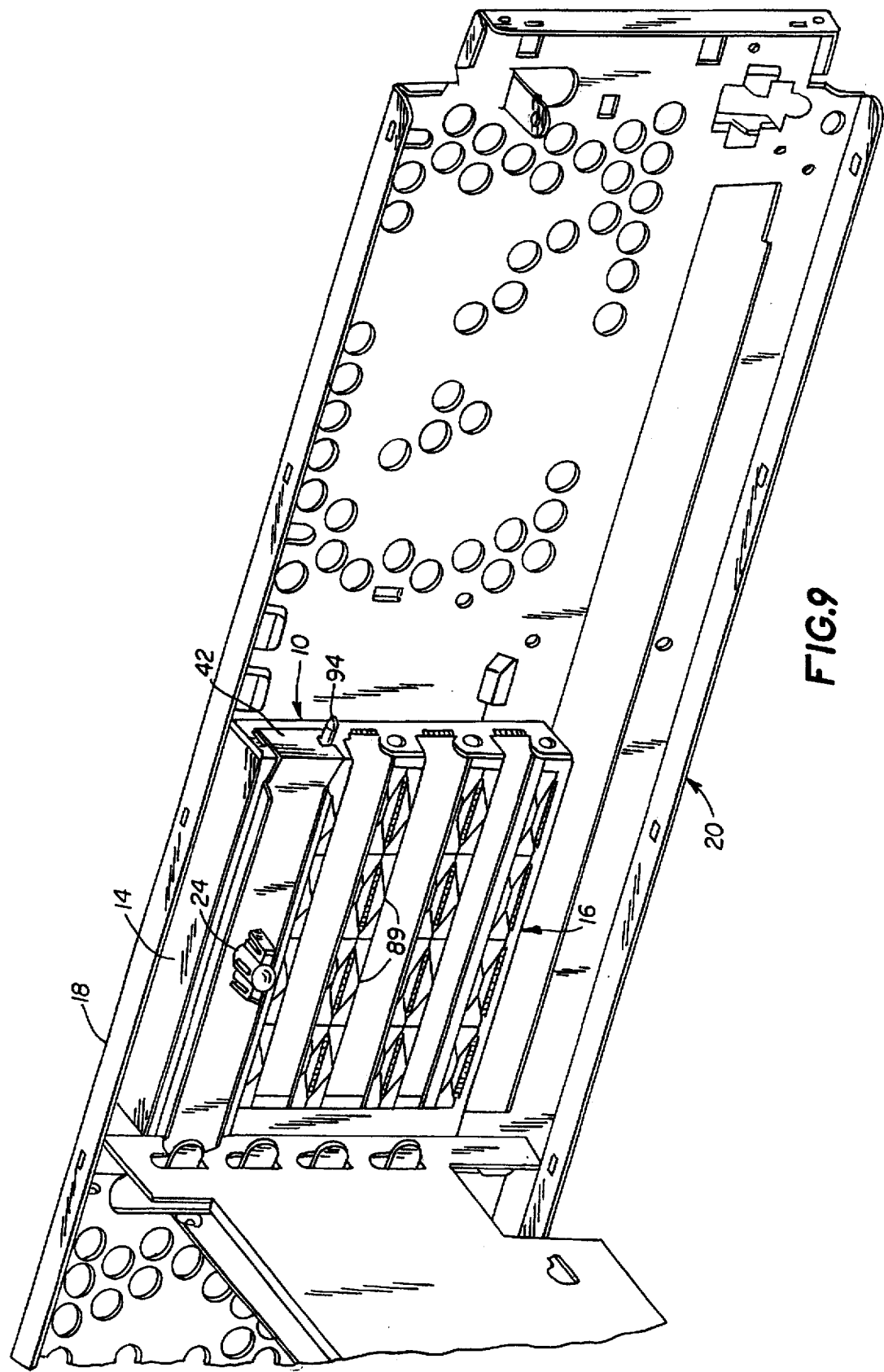
FIG. 9 is a perspective view of the internal surface of the rear panel showing the filler bracket installed over the card opening.

As was mentioned above, the filler bracket assembly 10 according to the present invention may be used to provide an EMI seal for the openings contained within standard ISA/ EISA/PCI card cages. Referring now to FIGS. 8 and 9, the filler bracket assembly 10 may be installed over the opening 12 in the rear panel 14 of the card cage 16 by sliding it into position in the direction of arrow 86. It is preferred, but not required, that each opening 12 in the rear panel 14 also include an EMI gasket 88 to assist in achieving a gap-free fit between the filler bracket assembly 10 and the opening 12. In one preferred embodiment, the EMI gasket 88 may comprise a spring steel gasket having a plurality of raised "points" 89 along its length to ensure good electrical contact between the gasket 88 and cover 22. Once the tongue end 40 of cover 22 is engaged (FIG. 9) the clamp 24 may be turned to the engaged position, whereupon the first and second panel engaging shoulders 66, 68 (FIG. 6) engage the opposed sides 28, 30 of opening 12. See FIGS. 1 and 2. To assist in locating the filler bracket assembly 10 over the opening 12, the card cage assembly may also include a locating pin 94 adapted to engage the bracket end 42 of cover 22. Alternatively, a screw (not shown) may also be used to secure the bracket end 42 to the card cage 16 in the conventional manner. The filler bracket assembly 10 may be removed by reversing the procedure described above.

It is contemplated that the inventive concepts herein described may be variously otherwise embodied and it is intended that the appended claims be construed to include alternative embodiments of the invention except insofar as limited by the prior art.

What is claimed is:

1. A filler bracket for closing off an opening in a panel, the panel having an external surface and an internal surface, the opening having two opposed sides, comprising:
   a cover having a front side and a back side; and
   a clamp rotatably mounted to the cover, said clamp including a panel engaging member for engaging the opening in the panel, said clamp drawing said cover against the panel when said clamp is rotated from a disengaged position to an engaged position.

2. The filler bracket of claim 1, wherein said panel engaging member comprises a first panel engaging shoulder and a second panel engaging shoulder positioned in opposed relation, wherein said first and second panel engaging shoulders engage the two opposed sides of the opening when said clamp is in the engaged position, and wherein said first and second panel engaging shoulders are disengaged from the two opposed sides of the opening when said clamp is in the disengaged position.

3. The filler bracket of claim 2, wherein said clamp further comprises a pivot shaft and wherein said cover includes a hole, said pivot shaft being insertable into said hole.

4. The filler bracket of claim 3, wherein said pivot shaft includes a clamp retaining shoulder engageable with the back side of the cover.

5. The filler bracket of claim 4, wherein the back side of said cover includes a first boss engageable with said clamp retaining shoulder.

6. The filler bracket of claim 5, wherein the back side of said cover includes a second boss engageable with said clamp retaining shoulder.

7. The filler bracket of claim 6, wherein the hole in said cover is adapted to receive said clamp retaining shoulder and wherein said pivot shaft of said clamp also includes a retaining arm for engaging the back side of the cover and preventing said clamp from being withdrawn from the hole in the cover.

8. The filler bracket of claim 7, wherein said clamp includes a handle to allow an operator to rotate said clamp from the engaged position to the disengaged position and vice-versa.

9. The filler bracket of claim 1, wherein said cover includes a first flange and a second flange located on the sides of the cover that are adjacent the two opposed sides of the opening, said first and second flanges increasing the stiffness of said cover.

10. The filler bracket of claim 1, wherein said cover also includes a tongue end for engaging a slot attached to the panel.

11. A clamp for retaining a cover over an opening in a panel, the panel having an external surface and an internal surface and the opening having two opposed sides, the cover having a front side and a back side and being sized to abut against the internal surface of the panel and cover the opening, comprising:
   an elongate pivot shaft having a proximal end and a distal end and adapted to be pivotally mounted in a hole in the cover;
   a first panel engaging shoulder attached to the proximal end of said pivot shaft;
   a second panel engaging shoulder attached to the proximal end of said pivot shaft and positioned in opposed relation to said first panel engaging shoulder so that said clamp can be rotated from an engaged position wherein said first and second panel engaging shoulders engage the two opposed sides of the opening on the external surface of the panel, to a disengaged position wherein said first and second panel engaging shoulders disengage the two opposed sides of the opening.

12. The clamp of claim 11, further comprising a clamp retaining shoulder mounted to the distal end of said pivot shaft for engaging the back side of the cover.

13. The clamp of claim 12, further comprising a retaining arm mounted to the distal end of said pivot shaft for engaging the back side of the cover and preventing said clamp from being withdrawn from the hole in the cover.

14. The clamp of claim 13, further comprising a handle mounted to the proximal end of said pivot shaft to allow an operator to rotate said clamp from the engaged position to the disengaged position and vice-versa.

15. A clamp for retaining a cover over an opening in a panel, the panel having an external surface and an internal surface and the opening having two opposed sides, the cover having a front side and a back side and being sized to abut against the internal surface of the panel and cover the opening, comprising an elongate pivot shaft having a proximal end and a distal end and adapted to be received by a hole in the cover, the proximal end of said elongate pivot shaft including a first panel engaging shoulder and a second panel engaging shoulder mounted in substantially opposed relation to the first panel engaging shoulder so that said clamp can be rotated from an engaged position wherein said first and second panel engaging shoulders engage the two opposed sides of the opening on the external surface of the panel, to a disengaged position wherein said first and second panel engaging shoulders disengage the two opposed sides of the opening, the distal end of said elongate pivot shaft including a clamp retaining shoulder for engaging the back side of the cover and a retaining arm for engaging the back side of the cover and preventing the clamp from being withdrawn from the hole in the cover.

16. A filler bracket for closing off an opening in a panel, the panel having an external surface and an internal surface, the opening having two opposed sides, comprising:

a cover having a front side and a back side and sized to abut against the back surface of the panel and to substantially cover the opening; and a clamp including an elongate pivot shaft having a proximal end and a distal end and adapted to be received by a hole in the cover, the proximal end of said elongate pivot shaft including a first panel engaging shoulder and a second panel engaging shoulder mounted in substantially opposed relation to the first panel engaging shoulder so that said clamp can be rotated from an engaged position wherein said first and second panel engaging shoulders engage the two opposed sides of the opening on the external surface of the panel, to a disengaged position wherein said first and second panel engaging shoulders disengage the two opposed sides of the opening, the distal end of said elongate pivot shaft including a clamp retaining shoulder for engaging the back side of the cover and a retaining arm for engaging the back side of the cover and preventing the clamp from being withdrawn from the hole in the cover.

17. A method of closing off an opening in a panel, the panel having an external surface and an internal surface, the opening having two opposed sides, comprising the steps of:

positioning a cover having a front side and a back side and sized to abut against the internal surface of the panel and substantially cover the opening; and rotating a clamp pivotally mounted to the cover from a disengaged position to an engaged position, the clamp having a first panel engaging shoulder and a second panel engaging shoulder mounted in substantially opposed relation to the first panel engaging shoulder so that when the clamp is in the engaged position the first and second panel engaging shoulders engage the two opposed sides of the opening on the external surface of the panel, and so that when the clamp is in the disengaged position the first and second panel engaging shoulders disengage the two opposed sides of the opening.

* * * * *